(12) United States Patent
Raebiger et al.

(10) Patent No.: US 6,821,859 B2
(45) Date of Patent: Nov. 23, 2004

(54) METHOD AND SYSTEM FOR CONTROLLING AN ELECTRICAL PROPERTY OF A FIELD EFFECT TRANSISTOR

(75) Inventors: Jan Raebiger, Dresden (DE); André Holfeld, Schirgiswalde (DE); Dirk Wollstein, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 90 days.

(21) Appl. No.: 10/208,564

(22) Filed: Jul. 30, 2002

(65) Prior Publication Data

US 2003/0162341 A1 Aug. 28, 2003

(30) Foreign Application Priority Data

Feb. 26, 2002 (DE) .......................................... 102 08 164

(51) Int. Cl.[7] ...................... H01L 21/66; H01L 21/336
(52) U.S. Cl. ......................... 438/303; 438/14; 438/305
(58) Field of Search ............................... 438/299, 301, 438/303, 305, 306, 307, 10, 14, 16

(56) References Cited

U.S. PATENT DOCUMENTS

| | | | |
|---|---|---|---|
| 5,863,824 A | 1/1999 | Gardner et al. | 438/303 |
| 5,963,784 A * | 10/1999 | Bothra et al. | 438/18 |
| 6,055,460 A | 4/2000 | Shopbell | 700/121 |
| 6,232,189 B1 | 5/2001 | Yi et al. | 438/301 |
| 6,239,467 B1 | 5/2001 | Gardner et al. | 257/344 |
| 6,287,877 B1 * | 9/2001 | Williams et al. | 438/14 |
| 6,295,630 B1 | 9/2001 | Tamegaya | 716/4 |
| 6,298,470 B1 | 10/2001 | Breiner et al. | 716/4 |
| 6,303,451 B1 * | 10/2001 | Zhang et al. | 438/301 |
| 6,649,426 B2 * | 11/2003 | Rangarajan et al. | 438/14 |

FOREIGN PATENT DOCUMENTS

| | | | |
|---|---|---|---|
| WO | WO 99/08306 | 2/1999 | H01J/37/304 |

* cited by examiner

Primary Examiner—T. N. Quach
(74) Attorney, Agent, or Firm—Williams, Morgan & Amerson, P.C.

(57) ABSTRACT

Methods and systems are disclosed that allow an adjustment of an electrical property of a field effect transistor during the fabrication of the device. A manufacturing process downstream of the gate electrode formation step is controlled in response to the measured gate length such that a deviation of the measured gate length is, at least partially, compensated by a subsequent process step in order to maintain the electrical property of the completed field effect transistor within specified tolerances. In one illustrative embodiment, the effective gate length that is defined as the lateral distance of lightly doped regions is controlled so as to substantially maintain it. Moreover, a controller is disclosed that allows the manufacturing of a field effect transistor on a run-to-run basis by which variations of the gate length are at least partially compensated.

30 Claims, 3 Drawing Sheets

METHOD AND SYSTEM FOR CONTROLLING AN ELECTRICAL PROPERTY OF A FIELD EFFECT TRANSISTOR

BACKGROUND OF THE INVENTION

1. Field of the Invention

The present invention relates to the field of fabricating semiconductor devices including field effect transistors (FETs), such as NMOS transistor elements and PMOS transistor elements, and, more particularly, to a method and a system for the improved controlling of the manufacturing process of field effect transistors to more reliably stabilize an electrical property of the completed devices.

2. Description of the Related Art

The dimensions of modem integrated circuits are steadily shrinking, while at the same time providing both improved device performance and circuit density. Both advantages are mainly obtained by steadily shrinking the feature sizes of the individual field effect transistor elements, such as MOS transistors, whereby critical dimensions, i.e., minimum feature sizes that can be reproducibly printed onto the substrate, are currently approaching the 0.1 μm range, and further reductions are anticipated in the future. The formation of modem ultra-high density integrated circuits requires approximately 500 individual process steps, wherein one of the most critical steps is the formation of the gate electrode of the field effect transistors. The gate electrode controls, upon application of a suitable control voltage such as 2–3 volts or even less in modem CPUs, the current flow through a channel that forms below a thin gate insulation layer separating the gate electrode from the underlying semiconductor region. Generally, the gate electrode is designed to have a width dimension on the order of micrometers and a length dimension, also referred to as gate length, currently on the order of 0.1 micrometers. This gate length, which separates the highly doped source and drain regions of the field effect transistor, significantly affects the device performance with respect to signal propagation time and current flow from the source to the drain. Trimming the gate length down to a size of about 0.1 μm necessitates an enormous effort to establish an appropriate lithography technique and a sophisticated etch trim method, wherein any deviation from a setting value of the gate length significantly contributes to a variation of the electrical properties of the completed transistor element. In particular, the on-current and the off-current, i.e., the current that flows when a conductive channel is formed between the source and the drain region and the current that flows when the conductive channel is not formed, as well as the switching speed, are greatly influenced by the gate length.

Generally, a reduced gate length leads to an increased on-current and to an increased switching speed of the transistor element. At the same time, however, the off-current, i.e., the undesired leakage current, also increases with a smaller gate length owing to an increased electrical field in the vicinity of the gate electrode. Accordingly, a reduced gate length compared to the setting value, although improving speed of the transistor element, may result in a lower yield of the completed transistor elements due to the increased and thus intolerable leakage current. On the other hand, an increased gate length compared to the setting value enhances the transistor characteristics with respect to leakage current, but entails a lower on-current and a lower speed of the transistor. As a consequence, circuit designers have to take into account the variation of the electrical properties of the individual transistor elements. Otherwise, the range of allowable gate lengths has to be set very tightly, thereby significantly reducing production yield and thus considerably contributing to the overall production costs.

In view of the above problems, it would be highly desirable to be able to control the electrical properties, such as the on-current and the off-current, the switching speed and the like, during the fabrication of the field effect transistors to improve yield and reproducibility of the devices.

SUMMARY OF THE INVENTION

Generally, the present invention is directed to a method and a system for controlling the process flow parameters for a field effect transistor on a run-to-run basis by at least partially compensating for the variation of the gate length by one or more of those process parameters of a subsequent process that tends to offset the effect of gate length variations on an electrical property under consideration.

According to one embodiment of the present invention, a method of controlling an electrical property of a field effect transistor during manufacturing the same comprises providing a substrate having formed thereon a gate electrode defining a length direction and a width direction. Moreover, an empirical value is determined that is indicative of an extension of the gate electrode in the length direction. Furthermore, the method includes completing the field effect transistor by: (a) forming a first spacer element adjacent to the gate electrode; (b) implanting ions into the substrate to form lightly doped regions adjacent to the gate electrode; (c) forming a second spacer element adjacent to the first spacer element; and (d) implanting ions into the substrate to form a source and a drain region. Thereby, at least one process parameter for controlling at least one of the process steps (a)–(d) is controlled on the basis of the empirical value.

In a further illustrative embodiment of the present invention, a method of controlling an electrical property of a field effect transistor during fabrication of the same comprises forming a gate electrode of the field effect transistor, wherein the gate electrode defines a width direction and a length direction. Furthermore, the method includes obtaining an empirical value indicative of a gate length of the gate electrode and forming a spacer element adjacent to the sidewall of the gate electrode while controlling at least one process parameter during the formation of the spacer element. Thereby, the controlling is performed such that a maximum extension of the spacer element in the length direction is increased when the empirical value indicates that the gate length is less than a predefined setting value and such that the maximum extension is decreased when the empirical value indicates that the gate length exceeds the predefined setting value.

According to a further illustrative embodiment of the present invention, a method of developing a run-to-run model for controlling an electrical property of a field effect transistor comprises determining a first plurality of experimental values, each being indicative of a gate length of the field effect transistor to be formed. Moreover, for each of the first experimental values, a second experimental value is determined that is indicative of at least one electrical property of the field effect transistor. Additionally, the method includes specifying at least one allowable setting value for the gate length of the field effect transistor on the basis of the first and second experimental values.

In a further illustrative embodiment of the present invention, a method of controlling the effective gate length of a field effect transistor comprises providing a substrate having formed thereon a gate electrode defining a length direction and a width direction. Moreover, an extension of the gate electrode in the length direction is determined by a measurement. Additionally, the method comprises forming doped regions adjacent to the gate electrode, wherein an implantation profile is controlled in correspondence to the extension of the gate electrode previously determined.

In a further embodiment, a system for controlling an electrical property of a field effect transistor during fabrication of the field effect transistor comprises a feed forward controller adapted to receive measurement results that indicate a gate length of a gate electrode formed on a substrate that has been processed, and to output at least one control signal to a process tool used for manufacturing the field effect transistor after the gate electrode has been formed. Furthermore, the system includes a communication line configured to transmit measurement signals to the feed forward controller and to provide said at least one control signal to the process tool.

BRIEF DESCRIPTION OF THE DRAWINGS

The invention may be understood by reference to the following description taken in conjunction with the accompanying drawings, in which like reference numerals identify like elements, and in which.

Figure 1:
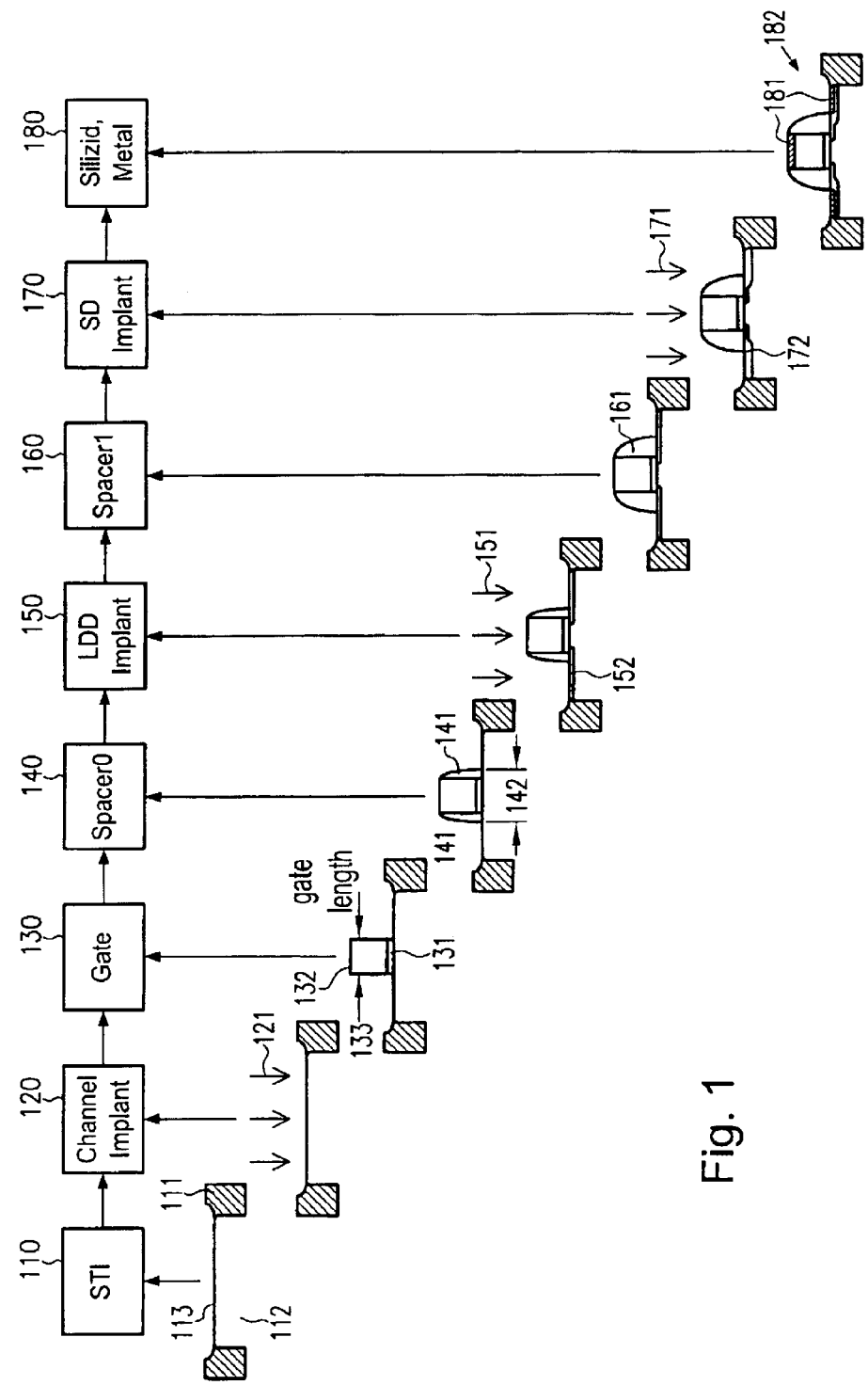
FIG. 1 schematically represents a conventional process flow used in manufacturing a field effect transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and strictures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the inventors' finding that any variation of the gate length during the complex process steps for forming a gate electrode of a field effect transistor may be compensated for, at least partially, by one or more subsequent process steps in which process parameters can reliably and reproducibly be readjusted.

With reference to FIG. 1, the individual process steps in a typical process flow for forming a field effect transistor, such as an MOS transistor, will briefly be discussed. In FIG. 1, a first process step 110, also referred to as STI (shallow trench isolation), describes a manufacturing stage in which shallow trench isolations 111 comprised of, for example, silicon dioxide, are formed in a semiconductor substrate 112 to define an active region 113 in which a field effect transistor is to be formed.

Next, a process step 120, also referred to as channel implant, indicates a manufacturing stage in which the substrate 112 is exposed to a beam of ions 121 to implant a specified dopant concentration within the active region 113 that is appropriate to achieve the required channel characteristics in terms of charge carrier concentration, mobility and the like of the field effect transistor to be formed.

Thereafter, in step 130, also referred to as gate formation, a gate insulation layer 131 is formed on the active region 113 and a gate electrode 132 is patterned on the gate insulation layer 131 from a polysilicon layer. The gate electrode 132 defines a width direction (not shown) perpendicular to the drawing plane of FIG. 1 and a length direction in the drawing plane and substantially parallel to the surface of the active region 113. An extension of the gate electrode 132 in the length direction, as indicated by the arrows 133, is also referred to as a gate length.

Next, in a process step 140, also referred to as spacer 0, a spacer element 141, which is also often referred to as a sidewall spacer, is formed adjacent to the gate electrode 132 at the sidewalls thereof. The spacer element 141 is comprised of a dielectric material, such as silicon dioxide or silicon nitride. Typically, forming the spacer element 141 includes blanket depositing the dielectric material and subsequently removing the dielectric material by a selective anisotropic etching process, wherein the initial layer thickness of the dielectric material and/or the step coverage of the dielectric material over the gate electrode 132 and/or the overetch time, i.e., the etch time after the dielectric material has substantially completely been removed on top of the gate electrode 132 and the surface portions of the active region 113 spaced apart from the gate electrode 132, determine a final maximum extension 142 of the spacer element 141, i.e., in FIG. 1 a footprint of the spacer element 141 in the length direction. Usually, the process parameters for depositing the dielectric material, adjusting the step coverage, and performing the anisotropic etching are relatively well-known and well-controllable so that the maximum extension 142 of the spacer element 141 may be well adjusted.

Next, in step 150, an ion implantation is carried out, indicated by the arrows 151, with a moderate dose and with an appropriate type of ions to form lightly doped regions 152 adjacent to the gate electrode 132. This is sometimes referred to as an extension implant process. It should be noted that the spacer element 141 acts as an implantation mask during the implantation step and thus influences the implantation profile of the lightly doped regions 152. It is also to be noted that while the spacer element 141 acts as an implantation mask, it does not prevent all implanted ions from migrating into the region below the spacer element 141 as is illustrated in FIG. 1. The reason for this is that the ions are subjected to diffusion once they have penetrated the active region 113, especially as a heat treatment is later performed to activate any implanted ions and to repair damage to the lattice structure of the substrate.

Next, in step 160, a second spacer element 161, also referred to as spacer 1, is formed adjacent to the sidewalls of the gate electrode 132, wherein the second spacer element 161 may or may not be formed of the same material as the spacer element 141, and formation of the second spacer element 161 may include substantially the same process steps as is explained with reference to the spacer element 141.

In step 170, also referred to as SD implant, an ion implantation process is carried out, indicated by the arrows 171, to form source and drain regions 172 in the active region 113. As with the spacer element 141, the second spacer element 161 also acts as an implantation mask to reduce the number of ions entering the region below the second spacer element 161. As previously explained, a heat treatment is performed to activate the implanted ions within the lightly doped regions 152 and the drain and source regions 172.

In step 180, also referred to as silicide/metal, silicided regions 181 are formed on the surface portions of the drain and source regions 172 and the gate electrode 132 to complete a field effect transistor element 182. Moreover, an insulating layer (not shown) may be formed over the field effect transistor 182 with openings formed over the drain and source regions 181 to accommodate metal plugs (not shown) for providing electrical contact to the field effect transistor 182.

For evaluating the electrical characteristics of the field effect transistor 182, at least one of the following properties may be measured: the on-current (drive current), the off-current, the rise and fall time when a corresponding signal is applied to the gate electrode and the frequency of an oscillator in which one or more field effect transistors 182 form a part of the oscillator. A commonly used oscillator for testing semiconductor circuits is a ring oscillator in which a plurality of stages are coupled to each other serially and a signal is positively coupled back from the output to the input of the circuit. A typical ring oscillator may be comprised of several inverter stages, wherein each inverter stage comprises a complementary pair of MOS transistors. In this respect, it should be noted that, regarding the above-indicated electrical properties, PMOS transistors substantially behave like NMOS transistors with the exception that the transistor on-current of the PMOS transistor is smaller than that of an NMOS transistor of comparable transistor size owing to the different type of charge carriers. Accordingly, although the process flow in FIG. 1 and in the following Figures is described with reference to an NMOS transistor, the discussion is also valid for PMOS transistors and complementary transistor pairs when the difference in on-current of the various transistor types is taken into consideration. For example, experimental data for complementary transistor pairs may be evaluated by defining an on-current that is the sum of the on-current of the NMOS transistor and a multiple of the on-current of the PMOS transistor.

Figure 2:
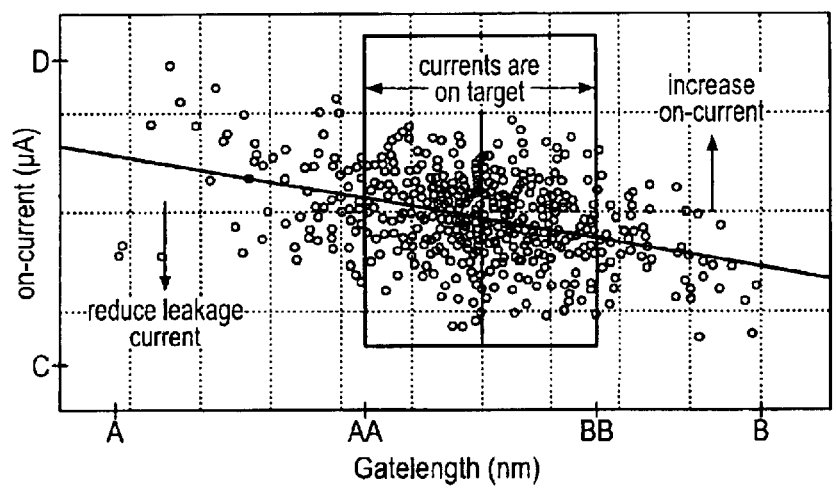
FIG. 2 shows measurement results depicting the relationship between the gate length and the on-current of field effect transistors.

FIG. 2 shows representative measurement results obtained from a plurality of field effect transistors, such as the transistor 182, that have been formed on a plurality of separate substrates. In FIG. 2, a vertical axis represents the on-current of the field effect transistors, whereas the horizontal axis represents the gate length of the respective field effect transistors. From FIG. 2 it is derivable that the gate length of the various field effect transistors varies in a range between A and B, depicted on the horizontal axis. The on-current of the field effect transistors varies between a range C and D, indicated on the vertical axis. Although there is a certain variation in the gate length, it is evident that most of the gate lengths are located within a relatively narrow range AA, BB, as depicted in FIG. 2. Moreover, it can be seen that the field effect transistors having a gate length remaining below the range AA–BB, left hand side of FIG. 2 (A–AA), exhibit a tendency to higher on-currents, whereas field effect transistors having a longer gate length, right hand side of FIG. 2 (BB–B), exhibit a tendency to lower on-currents. Although a shorter gate length involves higher switching speeds, the leakage current is also increased and therefore leads to a less reliable device, thereby significantly reducing production yields since higher leakage currents are, depending on the application, hardly tolerable in the final integrated circuit. On the other hand, the field effect transistors having the longer gate length exhibit a lower leakage current but suffer from a reduced on-current and a reduced speed of the transistor elements.

Since the gate length can be measured within the production line, according to the inventive finding, the information contained in the measurement results may be used in subsequent process steps to adjust other process parameters to compensate for gate length variations and the variations of electrical properties of the field effect transistors caused by the gate length variations. According to the present invention, process parameters of process steps following the gate formation step 130 may be controlled such that in the final device the on-current of field effect transistor elements, the gate length of which remains below a specified value, is increased, whereas the on-current of field effect transistor elements exceeding a specified gate length is increased.

Figure 3:
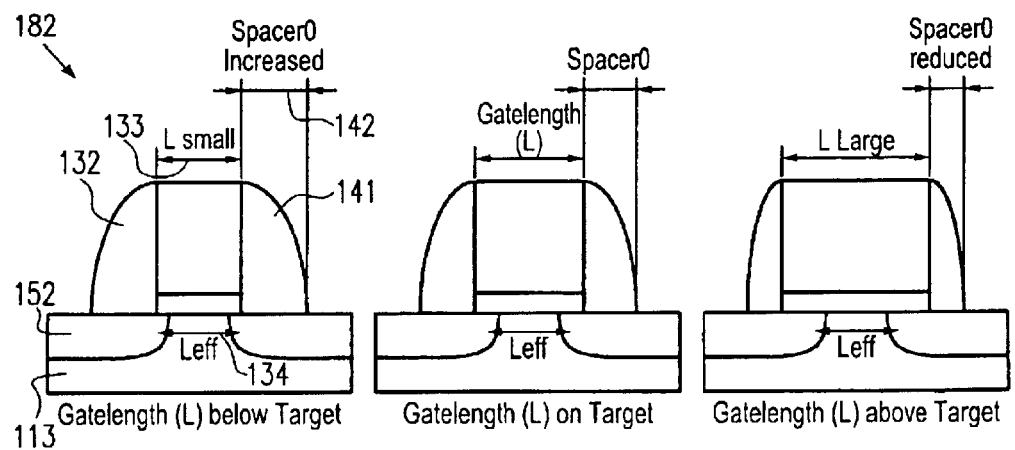
FIG. 3 schematically depicts the basic concept for controlling an electrical property of a field effect transistor according to one illustrative embodiment.

One basic mechanism that may be used in reducing the variation of the electrical property of the field effect transistor will be discussed with reference to FIG. 3. In FIG. 3, a schematic cross-sectional view of three variations of a field effect transistor 182 are depicted. For convenience, the same numeration is adhered to as in FIG. 1. In the left part of FIG.

3, a first variation of the field effect transistor 182 is illustrated. The gate electrode 132 exhibits the gate length 133, and the distance between the lightly doped regions 152 defines a channel length or an effective gate length 134. Generally, the effective gate length 134 is less than the gate length 133 due to the overlap of the lightly doped regions 152 with the gate electrode 132. It is, however, the effective gate length 134 that, among others, has a remarkable impact on the electrical characteristics of the field effect transistor 182. It is thus desirable to minimize a variation of the effective gate length 134 that will be obtained, according to the conventional process flow shown in FIG. 1, in conformity with a variation of the gate length 133.

In the conventional process flow, as described with reference to FIG. 1, the maximum extension 142 of the spacer element 141 is maintained substantially constant, that is, only a randomly distributed, slight variation occurs. As previously discussed, the process parameters and, thus, the complete process steps for forming the spacer element 141, are well-established and the formation of the spacer element 141 is accordingly highly reproducible with only moderate variations. As a consequence, the overlap of the lightly-doped regions 152 with the gate electrode 132 will exhibit approximately the same minor variations as the maximum extension 142 of the spacer element 141 since this maximum extension 142 substantially determines the masking effect of the spacer element 141 during the LDD implant 150. Thus, the effective gate length 134 correlates to the gate length 132 and varies correspondingly. In order to approximately maintain the effective gate length 134 at a desired value, the maximum extension 142 of the spacer element 141 may be adjusted in correspondence to the measured gate length 133. In the variation shown in the left portion of FIG. 3, the measured gate length 133 is smaller than a predefined target value of the gate length and consequently the maximum extension 142 of the spacer element 141 is correspondingly increased to substantially obtain a desired effective gate length 134.

In the center portion of FIG. 3, a second variation of the field effect transistor 182 is depicted, wherein the measured gate length 133 is substantially equal to the desired gate length, and, thus, the effective gate length 134 is substantially equal to a desired target value. Consequently, no adaptation of the maximum extension 142 of the spacer element 141 is required to obtain the desired effective gate length 134 that is substantially equal to the effective gate length of the former variation.

The right portion of FIG. 3 shows a third variation of the field effect transistor 182 in which the gate length 133 exceeds the desired gate length after the gate formation step 130 in FIG. 1. Accordingly, the maximum extension 142 of the spacer element 141 is correspondingly reduced so that the overlap of the lightly doped regions 152 and the gate electrode 132 during implantation is increased to obtain the effective gate length 134 that is substantially equal to the desired effective gate length.

In one embodiment, the correlation between the measured gate length 133 and the maximum extension 142 of the spacer element 141 may be obtained by empirically determining the influence of a varying maximum extension 142 on one or more electrical properties for a given measured gate length. To this end, a plurality of field effect transistors may be investigated, wherein during fabrication of the field effect transistors the maximum extension 142 of the spacer elements 141 is varied. From the plurality of field effect transistors, groups of devices may be identified exhibiting substantially the same gate length. Then, from these different groups of transistor elements, the effect of varying the maximal extension 142 may be estimated. On the basis of the measurement results of the one or more electrical properties of the field effect transistors, an optimal maximum extension 142 may be selected for a given measured gate length and corresponding corrected maximum extensions 142 for measured gate length deviating from the desired gate length may be determined. Once an experimental correlation between the measured gate length 133 and corresponding maximum extensions 142 is established, the compensation values for the maximum extension 142 during the actual process flow may be obtained by means of calculation, compensation values stored in advance, and the like.

In one illustrative embodiment, a target value for an uncorrected maximal extension 142 may range from approximately 10–50 nanometer (nm) for a gate length on the order of 100 nm, whereby the maximal extension 142 may be varied in the range of approximately ±10–50% of the target value to compensate for the gate length variations.

Figure 4:
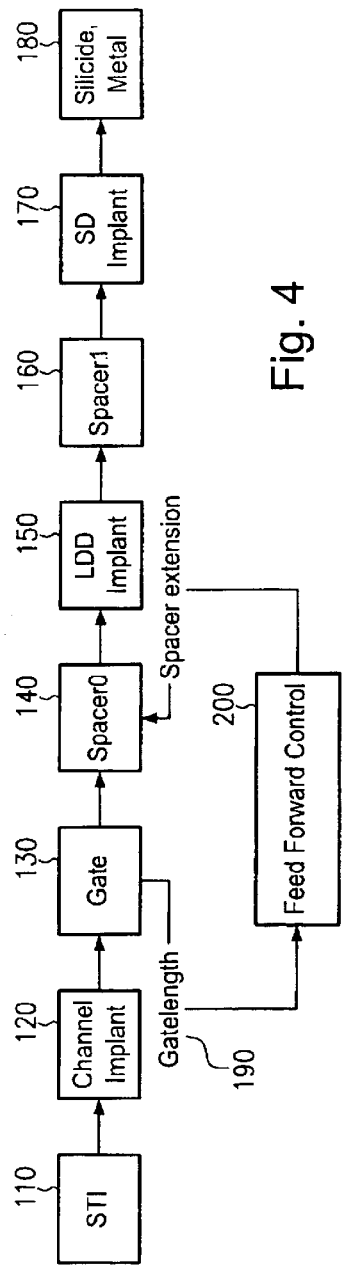
FIG. 4 schematically depicts a system for implementing a run-to-run control in the process flow for manufacturing a field effect transistor.

FIG. 4 schematically depicts a control system for controlling an electrical property of a field effect transistor on the basis of the principles discussed with reference to FIG. 3 and FIG. 2. In FIG. 4, the process flow of FIG. 1 is illustrated, wherein the same numerals are used for indicating equal process steps. In addition to the process flow depicted in FIG. 1, in step 190 of the present embodiment, the gate length 133 of at least some of the gate electrodes formed in step 130 are determined by measurement and are input into a feed forward controller 200 that is operatively connected to process tools (not shown) used in step 140. As is well known, the gate length may be measured, for example, optically by means of a scatterometer or any other appropriate means that is usually provided within the production line. The measurement results of the gate length are then entered into the feed forward controller 200, which is configured to output one or more process parameters for adjusting one or more process tools involved in forming the spacer element 141 in step 140. As previously discussed, the maximum extension 142 and, thus, the effect of the spacer element 141 in controlling the overlap of the lightly doped regions 152 with the gate electrode 132, depends on process parameters such as the initial dielectric layer thickness, the degree of step coverage, the overetch time and the like. Since, in particular the dielectric layer thickness, the step coverage and the overetch time are well-controllable process parameters, the maximum extension 142 may readily be reproduced within tightly-set manufacturing tolerances.

It is to be noted that the measured gate lengths obtained in step 190 do not necessarily need to be correlated directly with the maximum extension 142, but may, in one illustrative embodiment, be correlated directly with the process parameters controlling the manufacturing process of the spacer element 141. That is, the feed forward controller 200 may provide a control signal to the respective process tool, such as a deposition tool, an anisotropic plasma etch tool and the like, whereby a specific type of control signal is assigned to a measured gate length value or a certain range of measurement values. A corresponding correlation may be provided, for example, as one or more tables and/or by calculation when a mathematical representation for the correlation has been established. Moreover, in other embodiments, the correlation between the measured gate length and the finally obtained maximum extension 142 may be selected so that, as is depicted in FIG. 2, an allowable range of gate lengths is defined in advance and a change of process parameters in forming the spacer element 141 is only carried out if the measured gate length is outside of the predefined range. In one particular embodiment, the process parameters for adjusting the maximum extension 142 is corrected by changing the process parameters by a first constant amount if the gate length exceeds the predefined value range and by a second constant amount if the measured gate length remains below the predefined value range. Additionally, the feed forward controller 200 may be configured to receive measurement results from one or more electrical properties of the completed field effect transistor on the basis of which the feed forward controller 200 may then automatically readjust the first and second constants. In this manner, the parameter correlation is permanently updated.

In another illustrative embodiment, the feed forward controller 200 is adapted to determine a corresponding corrected value for the maximum extension 142 and/or for the process parameters in manufacturing the spacer element 141 individually for each of the measurement values obtained in step 190. For example, a corresponding correction may be made on the basis of the measurement result shown in FIG. 2, which are mathematically described by a fit function, for example a linear fit, as is also shown in FIG. 2. The linear fit may be used as the basic equation for correcting the maximum extension 142 of the spacer element 141 so as to decrease the maximum extension 142 for gate length measurement values exceeding a predetermined mean value and for increasing the maximum extension 142 for measurement results remaining below the predetermined mean value. It is to be understood that instead of a linear function any other suitable mathematical representation may be employed.

Moreover, the feed forward controller 200 may be implemented in the form of a microprocessor, a microcontroller, a work station or as a part of a facility management system as is usually provided in semiconductor production plants. In particular, implementing the feed forward controller 200 into the facility management system allows a fully automated process control to be realized, since then the feed forward controller 200 may be readily "informed" about further process conditions, such as state of the process tools, measurement results of completed devices and the like. The controller 200 may then respond to any recently occurred events.

Figure 5:
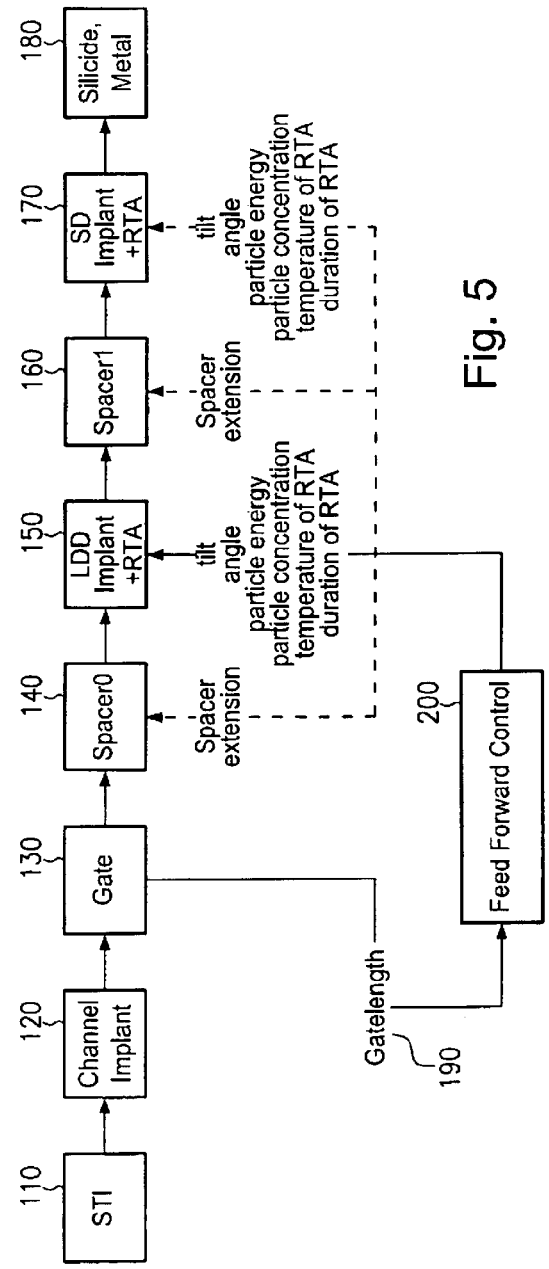
FIG. 5 schematically shows a system for controlling an electrical property of a field effect transistor by adjusting one or more process parameters of process steps following the gate formation.

With reference to FIG. 5, further illustrative embodiments of the present invention will be described. In FIG. 5, for the sake of convenience, the same numerals will be adhered to as are used in FIGS. 1–4. In FIG. 5, the feed forward controller 200 is configured to receive the measurement results obtained in step 190 and to output one or more control signals to adjust process parameters in at least one of the steps 140, 150, 160 and 170. In particular, the feed forward controller 200 may be adapted to control a tilt angle that may be used for the LDD implantation. As previously discussed, one dominant factor is the controlling of the effective gate length 134 so that it remains substantially constant. To this end, the overlap of the lightly doped regions 152 with the gate electrode 132 is to be controlled correspondingly, and contrary to what is shown in FIG. 1, the LDD implantation 151 may be performed as a multi-step implantation, wherein the implanted ions are directed to the surface of the active region 113 under a tilt angle. For example, a two-step implantation may be performed with a first tilt angle controlling the overlap of a lightly doped drain region with the gate electrode 132 and with a second tilt angle controlling the overlap of a lightly doped source region with the gate electrode 132. In another embodiment, a first implantation step may be carried out in the manner shown in FIG. 1, and in a second implantation step with a tilt angle, for instance, the overlap of the lightly doped source region may be controlled by varying the tilt angle in the second step.

As indicated by the dotted lines in FIG. 5, alternatively or additionally, the process parameters in one or more of the process flow steps 140, 160 and 170 may also be controlled to substantially maintain the effective gate length 134 constant. For example, in step 160, the maximum extension of the second spacer 161 may be controlled to influence the dopant profile and thus the overlap of the lightly doped regions 152 with the gate electrode 132. Although the effect of the extension of the second spacer element 161 on the finally obtained dopant profile is less dominant than, for example, the maximum extension 142 of the spacer element 141, the overall dopant profile may, nevertheless, be influenced by the second spacer element 161.

A further factor that may play an important role in partially compensating for gate length variations is the electrical field distribution during operation of the field effect transistor 182, which in turn is determined by the final dopant profile in the source and drain regions including the lightly doped regions 152. That is, in addition to the effective gate length 134 substantially defined by the overlap of the lightly doped regions 152 with the gate electrode 132, further factors, such as the concentration of dopants, their distribution within the lightly doped regions 152, the source and drain regions 172, etc., affect the electrical properties. In the following, this will be referred to as overall dopant profile. The electrical properties, such as on-current, leakage current and the like, may accordingly also be controlled by adjusting the overall dopant profile.

Additionally or alternatively, in one embodiment, other process parameters of the implantation step, such as the energy of the ions and/or the concentration of the ions during the implantation steps 150, 170, may be controlled to correspondingly adjust the overall dopant profile.

In a further embodiment, the heat treatment required to activate the ions and to cure crystal damage in the implant steps 150 and 170 may be accomplished by a rapid thermal annealing (RTA) process during which the implanted ions diffuse within the active region 113. The diffusion activity depends on the temperature and the duration of the RTA process. Thus, the process parameters temperature of the RTA and/or the duration of the RTA may also be employed to control the overall dopant profile. Since the RTA following the SD implant 170 also affects the dopant concentration, the temperature and/or the duration of the RTA in step 170 may also be used to adjust the overall dopant profile and thus the electrical property of the transistor 182 to be formed.

Adjusting the overall dopant profile so as to obtain an on-current in a predefined desired value range when the measured gate length is too long may additionally result in an increased switching speed of the field effect transistor 182 since, for example, merely decreasing the maximum extension 142 of the spacer element 141 (see FIGS. 1 and 3), will indeed result in an increased overlap between the lightly doped regions 152 and the gate electrode 132, and thus in a substantially constant effective gate length. However, the increased overlap may cause the so-called Miller capacitance, i.e., the capacitance between gate-drain and gate-source, to increase and therefore to slow down the field effect transistor 182 during operation. Moreover, an increased overlap of the lightly doped regions 152 with the gate electrode 132 may possibly lead to an increased leakage current owing to an increased hot carrier effect, i.e. to an increased capture of charge carriers in the gate insulation layer or even passage of charge carriers through the gate insulation layer into the gate electrode 132. As a result, in one illustrative embodiment, the feed forward controller 200 may be configured to adjust the process parameters for forming the second spacer element 161 in addition or alternatively to adjusting one of the process parameters for the process flow steps 140 and/or 150 when the measured gate length exceeds a specified maximum gate length which would, upon only adapting the maximum extension 142, require an overlap of the lightly doped region 152 with the gate electrode 132 that could be considered inappropriate in some applications. For example, the extension of the spacer element 161 may be reduced to obtain a higher dopant concentration in the vicinity of the gate electrode 132 and thus adjust the electrical property. Similarly, the feed forward controller 200 may be adapted to adjust, additionally or alternatively, the implantation parameters of step 170. For instance, the source drain implantation 170 may be performed as a multi-step implantation using a tilt angle analogous to the process step 150 in the LDD implantation.

In order to establish a control strategy when two or more process flow steps are involved in controlling the electrical properties of the field effect transistor 182, respective sensitivity parameters may be determined by experiment, which quantify the influence of variations in these process steps on the electrical property or properties under consideration. For instance, the effect of varying the maximum extension 142 of the spacer element 141 on the on-current, the off-current, i.e., the leakage current, and the switching speed may be determined. As is pointed out with reference to FIG. 3, substantially maintaining the effective gate length 134 as a constant may result in an on-current within a predefined value range but may also possibly lead to an increased leakage current and an increased Miller capacitance when the measured gate length exceeds the target value of the gate length (see third variation in FIG. 3). Thus, the sensitivity parameters may be obtained for a plurality of electrical properties for each of the process flow steps shown in FIG. 5. On the basis of these sensitivity parameters thus obtained, an algorithm may be established that selects a combination of control activities with an optimum final effect on the completed field effect transistor 182. For example, if the gate length measurement step 190 indicates that the measured gate length considerably exceeds a desired gate length, a combination of control signals weighted by the respective sensitivity parameters may be provided to the various process flow steps so as to obtain an optimum correction result with respect to the one or more of electrical properties of interest of the field effect transistor 182. This means that in the example given above, the maximum extension 142 of the spacer element 141 is increased less than it has to if the maximum extension 142 is the only control variable, but additionally, for instance, the tilt angle and/or the implantation energy and/or the implantation dose in the source-drain implantation is varied to additionally obtain a higher concentration in the vicinity of the gate electrode 132. The combination of these two correction activities may result in an increased on-current while maintaining the leakage current and/or the Miller capacitance within predefined tolerances. Similarly, more than two process flow steps may be controlled that are weighted by the respective sensitivity parameters and combined to obtain an optimum compensation result.

The embodiments described so far may be carried out in a control operation on a substrate-to-substrate basis or on a lot-to-lot basis. In one illustrative embodiment, the measurement results obtained in step 190 represent an averaged value of a lot of substrates and the feed forward controller 200 adjusts one or more process parameters of one or more of the process flow steps 140 to 170 for the lot for which the averaged gate length measurement results have been obtained.

Moreover, although in the embodiments described above, the gate length is referred to as a direct measurement value, it is to be understood that the measurement value of any appropriate parameter indicative of the gate length may be used. For example, a signal from a metrology tool, such as a scatterometer, may directly or in a suitably processed form be provided, and the control operation may be carried out on the basis of this signal, thereby eliminating the necessity for a complex signal processing that may be required for obtaining the gate length from the signal.

In a further embodiment, the feed forward controller 200 may be configured to receive signals or values indicative for the electrical property under consideration. The controller may further comprise an update section (not shown) in which the "degree" of correction of the individual process parameters is adapted to the most recent measurement signals or values. That is, the influence of, for example, the temperature of the RTA used in the LDD implantation 150 (FIG. 5) may be determined in advance, for instance by tabulated values, or on-line by an appropriate model, and these tabulated values or the model may be readjusted when the measurement values of the electrical property under consideration is outside a predefined range. In this way, the effect of the process parameters is continuously updated. Updating may be performed for one or more process parameters.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of controlling an electrical property of a field effect transistor during manufacturing the same, the method comprising:

providing a substrate having formed thereon a gate electrode defining a length direction and a width direction;

determining an empirical value indicative of an extension of the gate electrode in the length direction; and completing the field effect transistor by:

(a) forming a first spacer element adjacent to the gate electrode;

(b) implanting ions into the substrate and heat-treating the substrate to form lightly doped regions adjacent to the gate electrode;

(c) forming a second spacer element adjacent to the first spacer element;

(d) implanting ions into the substrate and heat-treating the substrate to form a source and a drain region; wherein:

at least one process parameter for controlling at least one of the process steps (a) to (d) is controlled on the basis of the determined empirical value.

2. The method of claim 1, further comprising determining a relationship between the empirical value and the at least one process parameter for controlling at least one of the process steps (a) to (d).

3. The method of claim 1, wherein said at least one process parameter includes at least one of:
- a dielectric layer thickness, a step coverage, an etch time in forming the first spacer element,
- a tilt angle, an implantation energy, a dose during implanting ions for forming the lightly doped regions,
- a temperature during the heat-treatment, a duration of the heat-treatment,
- a dielectric layer thickness, a step coverage, an etch time in forming the second spacer element,
- a tilt angle, an implantation energy, a dose during implanting ions for the formation of the source and drain region,
- a temperature of the heat treatment and a duration of the heat treatment for the formation of the source and drain region.

4. The method of claim 1, further comprising obtaining at least one sensitivity parameter specifying the effect of the at least one process parameter on said electrical property.

5. The method of claim 1, further comprising defining an allowable range of gate lengths and varying said at least one process parameter when the determined gate length is outside of said allowable range.

6. The method of claim 1, wherein said empirical value represents a mean value for a plurality of gate electrodes formed on different substrates.

7. The method of claim 6, wherein said at least one process parameter is controlled for a plurality of substrates to be processed.

8. The method of claim 4, wherein a plurality of sensitivity parameters for two or more electrical properties of the field effect transistor to be formed are determined, whereby each of the plurality of sensitivity parameters specifies the effect of one of the process flow steps (a) to (d) on one of the two or more electrical properties.

9. The method of claim 1, wherein during step (a) a maximum extension of the first spacer element in the length direction is controlled such that the maximum extension is decreased when the measured length of the gate is less than a predefined setting value and such that the maximum extension is increased when the measured gate length exceeds said setting value.

10. The method of claim 1, further comprising monitoring said electrical property of the completed field effect transistor.

11. A method of forming a field effect transistor, comprising:
- patterning a gate electrode on a substrate on which the field effect transistor is to be formed, the gate electrode defining a length direction and a width direction;
- determining a measurement value of the length of the patterned gate electrode;
- determining an empirical value that correlates an electrical property of said transistor with an extension of a first spacer element to be formed adjacent said gate electrode and a measured length of said gate electrode, wherein said empirical value is empirically determined by varying a maximum extension of a first spacer formed adjacent a plurality of gate electrodes having the same approximate gate length;
- forming said spacer element adjacent to the gate electrode while controlling a maximum extension of the spacer element in the length direction on the basis of said measurement value; and
- implanting ions into the substrate to form lightly doped regions adjacent to the gate electrode.

12. The method of claim 11, wherein controlling a maximum extension of the spacer element includes controlling at least one of a dielectric layer thickness deposited during the formation of the spacer element, adjusting a step coverage of the gate electrode during deposition of the dielectric layer, and etch parameters of the selective anisotropic etching during the formation of the spacer element.

13. The method of claim 11, further comprising determining at least one setting value for the gate length of the gate electrode.

14. The method of claim 13, wherein said maximum extension of the spacer element is increased when said measurement value is below said at least one setting value and wherein said maximum extension is decreased when said measurement value exceeds said at least one setting value.

15. The method of claim 14, wherein a second setting value is determined, the second setting value being less than said setting value, wherein said maximum extension of the spacer element is increased when said measurement value remains below the second setting value.

16. The method of claim 11, further comprising determining a correlation between said maximum extension of the spacer element and at least one electrical property of the field effect transistor and controlling the maximum extension on the basis of the measured value and said determined correlation.

17. The method of claim 11, further comprising determining a sensitivity parameter specifying the effect of a variation of said maximum extension of the spacer element on said at least one electrical property.

18. The method of claim 17, further comprising monitoring said at least one electrical property of the completed field effect transistor.

19. The method of claim 18, further comprising readjusting said sensitivity parameter on the basis of the monitored at least one electrical property.

20. A method of adjusting at least one electrical property of a field effect transistor during fabrication of the field effect transistor, the method comprising:
- forming a gate electrode of the field effect transistor, the gate electrode defining a width direction and a length direction;
- obtaining an empirical value that correlates an electrical property of said transistor with an extension of a first spacer element to be formed adjacent said gate electrode and a measured length of said gate electrode, wherein said empirical value is empirically determined by varying a maximum extension of a first spacer formed adjacent a plurality of gate electrodes having the same approximate gate length; and
- forming said spacer element adjacent to the gate electrode while controlling at least one process parameter such that a maximum extension of the spacer element in the length direction is increased when said empirical value indicates that the gate length is less than a first predefined setting value, and such that the maximum extension is decreased when said empirical value indicates that the gate length exceeds a second predefined setting value.

21. The method of claim 20, wherein the first predefined setting value is less than the second predefined value.

22. The method of claim 20, further comprising establishing a correlation between said empirical value and the at least one electrical property of the field effect transistor.

23. The method of claim 20, wherein said maximum extension of the spacer element is increased by about 10–50% of a target value when the gate length is less than the first setting value, and wherein the maximum extension is decreased by about 10–50% of the target value when the gate length exceeds the second setting value.

24. The method of claim 20, wherein a plurality of gate electrodes are formed on a plurality of substrates, and said empirical value is obtained as a mean value of the plurality of substrates.

25. The method of claim 24, wherein the at least one process parameter is commonly controlled for the plurality of substrates.

26. A method of controlling at least one electrical property of a field effect transistor during manufacturing the same, the method comprising:
   providing a substrate having formed thereon a gate electrode defining a length direction and a width direction;
   determining an empirical value determining an empirical value that correlates an electrical property of said transistor with an extension of a first spacer element to be formed adjacent said gate electrode and a measured length of said gate electrode, wherein said empirical value is empirically determined by varying a maximum extension of a first spacer formed adjacent a plurality of gate electrodes having the same approximate gate length of an extension of the gate electrode in the length direction; and
   forming doped regions adjacent to the gate electrode, wherein an overall dopant profile is controlled in correspondence to the empirical value previously determined.

27. The method of claim 26, wherein the overall dopant profile is controlled by adjusting at least one process parameter of at. least one of the process steps forming first spacer elements adjacent to the gate electrode, the process steps including implanting ions and heat-treating the substrate to form lightly doped regions adjacent to the gate electrode, forming a second spacer element adjacent to the gate electrode and implanting ions and heat-treating the substrate to form a source and a drain region.

28. The method of claim 27, wherein said at least one process parameter is at least one of an implantation angle, implantation energy, dose during at least one of the implantation steps, temperature during the heat treatment, duration of the heat treatment, layer thickness of a material layer deposited during one of the spacer element forming steps, step coverage of the material layer and etch time in etching said material layer.

29. The method of claim 27, further comprising determining a measurement value indicative of the at least one electrical property of the field effect transistor and adjusting the at least one process parameter on the basis of said measurement value.

30. The method of claim 29, wherein adjusting the at least one process parameter includes updating of at least one correction value for the at least one process parameter when said measurement value is outside of a predefined range.

* * * * *

UNITED STATES PATENT AND TRADEMARK OFFICE
CERTIFICATE OF CORRECTION

PATENT NO. : 6,821,859 B2  Page 1 of 1
DATED : November 23, 2004
INVENTOR(S) : Jan Raebiger, Andre Holfeld and Dirk Wollstein It is certified that error appears in the above-identified patent and that said Letters Patent is hereby corrected as shown below:

Column 12,
Lines 52-53, delete "indicative of an extension of the gate electrode in the length direction" and insert therefore
-- that correlates an electrical property of said transistor with an extension of a first spacer element to be formed adjacent said gate electrode and a measured length of said gate electrode, wherein said empirical value is empirically determined by varying a maximum extension of a first spacer formed adjacent a plurality of gate electrodes having the same approximate gate length --.
Line 55, "forming a first" should be -- forming said first --.

Column 15,
Line 19, delete "determining an empirical value" (first occurrence).

Column 16,
Line 3, delete the period after "at".

Signed and Sealed this

Eighth Day of February, 2005

JON W. DUDAS
*Director of the United States Patent and Trademark Office*